United States Patent
Utathin et al.

(10) Patent No.: US 8,875,537 B1
(45) Date of Patent: Nov. 4, 2014

(54) METHOD OF AND SYSTEM FOR COOLING A SINGULATION PROCESS

(75) Inventors: Sorasak Utathin, Samutprakarn (TH); Sukunya Kitcharaenthamrong, Bangkok (TH); Nopnarintr Rabuapin, Sumuthprakarn (TH)

(73) Assignee: UTAC Thai Limited, Bangna Bangkok (TH)

( * ) Notice: Subject to any disclaimer, the term of this patent is extended or adjusted under 35 U.S.C. 154(b) by 1207 days.

(21) Appl. No.: 12/070,191

(22) Filed: Feb. 14, 2008

Related U.S. Application Data

(60) Provisional application No. 60/901,547, filed on Feb. 14, 2007.

(51) Int. Cl.
F25D 17/02 (2006.01)

(52) U.S. Cl.
USPC .............................. 62/373; 62/64

(58) Field of Classification Search
CPC ...... F25D 17/02; B23Q 11/10; B23Q 11/126; B23Q 11/1007; B23C 5/28
USPC ............... 62/62, 64, 259.2, 373; 83/171, 196; 184/6.14
See application file for complete search history.

(56) References Cited

U.S. PATENT DOCUMENTS

| | | | |
|---|---|---|---|
| 3,169,923 A | 2/1965 | Guarnaccio et al. | 252/32.5 |
| 3,203,895 A | 8/1965 | Latos et al. | 252/32.5 |
| 3,750,847 A * | 8/1973 | Sluhan | 184/109 |
| 3,877,682 A * | 4/1975 | Moss | 366/132 |
| 4,419,234 A * | 12/1983 | Miller et al. | 210/232 |
| 4,772,402 A | 9/1988 | Love | |
| 5,048,599 A * | 9/1991 | Tustaniwskyj et al. | 165/104.32 |
| 5,244,586 A * | 9/1993 | Hawkins et al. | 210/806 |
| 5,372,220 A | 12/1994 | Jacobs et al. | 184/6.14 |
| 5,494,134 A * | 2/1996 | McConkey | 184/6.14 |
| 5,832,585 A | 11/1998 | Takiar et al. | 29/424 |
| 5,923,995 A | 7/1999 | Kao et al. | 438/460 |
| 6,386,948 B1 * | 5/2002 | Kondo | 451/28 |
| 6,414,385 B1 | 7/2002 | Huang et al. | |
| 6,428,883 B1 | 8/2002 | White | 428/323 |
| 6,451,709 B1 | 9/2002 | Hembree | |
| 6,508,944 B1 * | 1/2003 | Bratten | 210/805 |
| 6,521,513 B1 | 2/2003 | Lebens et al. | 438/462 |
| 6,655,245 B2 * | 12/2003 | Schuettel | 82/1.11 |
| 6,902,469 B2 | 6/2005 | Kondo et al. | 451/44 |

(Continued)

OTHER PUBLICATIONS

Office Action dated Oct. 3, 2012, U.S. Appl. No. 12/235,124, filed Sep. 16, 2011, Sorasak Utahin et al.

(Continued)

*Primary Examiner* — Lakiya Rogers
(74) *Attorney, Agent, or Firm* — Haverstock & Owens LLP

(57) ABSTRACT

A system for cooling at least one singlulation saw used to singulate components from a substrate. The system is comprised of a coolant loop having at one or more coolant delivery element, a coolant collection element, one or more recycle tanks for contaminate particles to settle out of the captured coolant, a mixing tank configured after the recycle tanks within the loop to produce and replace lost coolant, and a cooling element to cool the coolant. The system can also include filters within the loop to remove particles not removed by the settling tank. Further, the system is able to be configured with a holding tank configured to prevent any bubbles from getting to the coolant delivery element.

10 Claims, 3 Drawing Sheets

(56) References Cited

U.S. PATENT DOCUMENTS

| | | | |
|---|---|---|---|
| 6,938,633 B2 * | 9/2005 | Sugata et al. | 137/1 |
| 7,281,535 B2 * | 10/2007 | Mihai et al. | 125/13.01 |
| 2005/0056135 A1 | 3/2005 | Hall et al. | 83/851 |
| 2005/0268899 A1 | 12/2005 | Mihia et al. | 125/13.01 |
| 2007/0052076 A1 | 3/2007 | Ramos et al. | |
| 2007/0175304 A1 | 8/2007 | In't Veld et al. | 83/169 |

OTHER PUBLICATIONS

Office Action mailed on Dec. 3, 2012, U.S. Appl. No. 12/235,124, filed Sep. 16, 2011, Sorasak Utahin et al.

* cited by examiner

Prior Art

METHOD OF AND SYSTEM FOR COOLING A SINGULATION PROCESS

CROSS REFERENCE TO RELATED APPLICATIONS

This application claims priority of and incorporates by reference provisional application Ser. No. 60/901,547, filed Feb. 14, 2007, and entitled: CENTRALIZE COOLANT CLOSE LOOP.

FIELD OF THE INVENTION

The present invention relates generally to the field of substrate processing. More specifically, the invention relates to the cooling of a singulation saw blade used to singulate individual dies from a substrate.

BACKGROUND OF THE INVENTION

Singulation is the process of cutting individual dies from their lead frames on a substrate containing a number of dies. When cutting a substrate at a high speed, the resulting friction and resulting heating of the substrate is an obstacle to high speed singulation. Excessive heat from singulation can damage the die electronics and render the die electronics inoperative. Thus, coolant is used to cool and lubricate the cutting blade and substrate during singulation. FIG. 1 illustrates a prior art system 100 for cooling a saw blade 151 during singulation. The prior art cooling system 100 includes a mixing system 110, a chemical tank 120, a cooling coil 130, a pre-mixing filter 140, post mixing filter 145 and a coolant delivery means 155.

The mixing system 110 is filled with deionized water from a deionized water source 125 and a chemical from the chemical tank 120. The deionized water and the chemical are mixed in the mixing tank. This coolant within the mixing tank chamber 111 is chilled by the cooling coil 130. The fluid in the mixing chamber 111 is pumped though a filter 145 and an coolant delivery means 155 delivers the coolant onto the saw blade 151 while singulating the dies from the substrate 152. The used coolant is captured by a pan 157 for return to the mixing tank 110. This used coolant contains substrate particles from the singulation process. The larger particles are filtered out by a filter 140, such as a 100 micron filter. However, smaller particles enter the mixing system 110 and accumulate to form a sludge in the bottom of the mixing tank chamber 111.

Eventually, the cooling system 100 and singulation saw 150 has to be stopped to clean the sludge from the mixing tank chamber 111 or to clean or replace the filters 140 and 145. This stoppage causes a loss of the singulation tool productivity and the removal of the sludge causes a loss of coolant. Further, the prior art system 100 is prone to the formation of bubbles which can travel into the cooling line from the mixing and recirculation of the used coolant. These bubbles will cause gaps in the delivery of coolant to the saw blade 151 which can cause sudden heating of the sawblade 151 and thus potentially damage the electronic components being singulated. A further disadvantage of the prior art system 100 is that the system is designed for a single saw which increases the space utilization for each singulation system.

What is needed is a cooling system that has less coolant loss, requires less cleaning due to sludge buildup, does not introduce bubbles into the coolant stream, and can provide coolant to more than one singulation saw, and can continue to operate while cleaning the filters and tanks.

BRIEF SUMMARY OF THE INVENTION

The invention provides a structure for and method of providing a coolant flow in a singulation process.

It is to be understood that the terminology used herein is for the purpose of describing particular aspects only and is not intended to be limiting. In this specification and in the claims which follow, reference will be made to a number of terms which shall be defined to have the following meanings: it will be understood that, as used in the specification and the appended claims, the singular forms "a," "an," and "the" include plural referents unless explicitly stated otherwise. "Optional" or "optionally" means that the subsequently described event, circumstance can or cannot occur, and that the description includes instances where the event circumstance or construction can or cannot occurs and instances where it does not. Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect.

Additional features and advantages of the invention will be set forth in the description which follows, and in part will be obvious from the description, or can be learned by the practice of the invention. The features and advantages of the invention can be realized and obtained by means of the instruments and combinations particularly pointed out in the appended claims. These and other features of the present invention will become more fully apparent from the following description and appended claims. Further, such features of the present invention can be learned by the practice of the invention as set forth hereinafter.

A first aspect of the invention, is for a system for cooling at least one singulation process. The system forms a first cooling loop that includes at least one coolant delivery means, a recycle coolant collection means configured to capture a recycle coolant, at least one recycle tanks configured for the settling of particulates from the coolant, a mixing tank configure downstream of the recycle tank, and a coolant temperature control means.

In one embodiment, the singulation cooling system includes a bypass loop where some of the coolant within the first coolant loop bypasses the coolant delivery means and passes back to the coolant temperature control means.

In a further embodiment, a plurality of course filters are placed in the cooling loop upstream of the mixing tank and configured to remove large particles from the coolant. In another embodiment, the cooling loop includes a plurality of fine filters downstream of the mixing tank. In one embodiment of the invention, multiple course filter elements are configured in a parallel format. In this way, at least one course filter element can be removed and replaced or cleaned while the cooling system is operating by closing the valves upstream and downstream of the removed course filter element. multiple fine filter elements can be configured in a parallel format. Likewise, multiple fine filter elements can be configures in a parallel format. Valves are installed upstream and downstream of each fine filter element. In this way, at least one fine filter element can be removed and replace or cleaned while the cooling system is operating. It will be appreciated that this sequence can be modified. For example, both course and fine filters can be upstream or downstream of the mixing tank. Preferably the course filter is upstream of the fine filter. In a further embodiment, the course filters are configured to remove particles 50-100 microns in size and the fine filters are configured to remove particles between 10-25 microns in size.

In a further embodiment, the singulation cooling loop includes a holding tank where the holding tank is configured to prevent air bubbles from getting into the coolant delivery means. In a further embodiment, the mixing tank includes of a controllable deionized water source inlet, a controllable chemical inlet, a mixing tank coolant level detection means, means for controlling the deionized water source inlet and chemical coolant inlet flow based on the coolant level, a recycle coolant inlet, a coolant mixing means, and a mixing tank coolant outlet. In one embodiment, the temperature of the coolant is controlled to be between 18-20 degrees centigrade. In another embodiment, the holding tank is configured for bubbles not to enter the coolant outlet and to have a capacity of greater than 1000 liters.

In a second aspect of the invention, a method of generating a cooling loop for at least one singulation process is disclosed. The process steps include controlling a coolant temperature, delivering the coolant to at least one singulation process and thereby generating a recycle coolant, collecting the recycle coolant, settling particulates from the recycle coolant, and generating a mixed coolant by mixing the recycle coolant, deionized water, and a chemical.

In one embodiment of the method further comprises the steps of generating a coolant bypass loop wherein a bypass coolant flows in proximity to the one or more singulation processes, and generating a coolant by combining the mixed coolant and the bypass coolant.

In one embodiment, the recycle coolant is filtered. In a further embodiment, the coolant is also filtered. In an embodiment course filtering is performed before the mixing. In a further embodiment, the filtering is performed by filtering elements that are replaceable while the cooling loop is operating. In one embodiment, the filtering is implemented by filtering elements configured in parallel. In one embodiment, the course filter is able to have filtering elements that remove particulates ranging from 100-50 microns and the fine filter having filtering elements that remove particles from 10-25 microns.

In a further embodiment, the method of cooling at least one singulation processes includes removing air bubbles from the coolant and thereby the coolant delivered to the singulation process is never substantially interrupted by an air bubble. In one embodiment, the bubbles are removed in a tank that is greater than 1000 liters.

In another embodiment, the step of mixing the coolant includes the steps of detecting the need for additional coolant, controlling the flow of deionized water for mixing, controlling the flow of a chemical for mixing, and mixing the deionized water, chemical, and recycled coolant. In a further embodiment, the coolant temperature is controlled to be between 18-20 degrees centigrade.

BRIEF DESCRIPTION OF THE DRAWINGS

In the drawings, like reference numbers are used when describing the same elements.

DETAILED DESCRIPTION OF THE PRESENT INVENTION

The present invention discloses a system for and a method of cooling a singulation process. Preferably, the singulation process uses a saw blade to cut electronic die components from a substrate. A singulation tool is a saw for cutting a substrate or a semiconductor wafer into individual electronic circuit dice.

Figure 1:
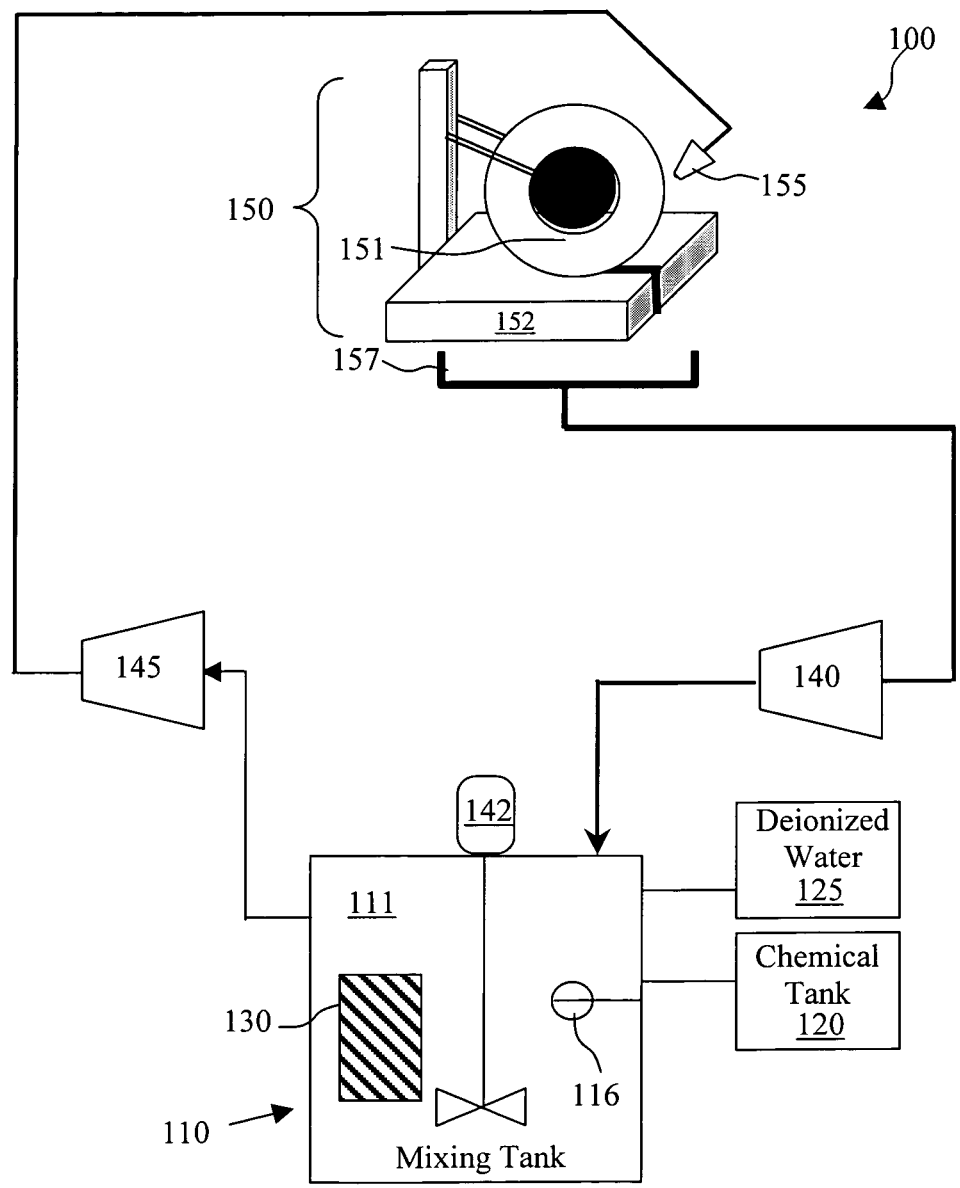
FIG. 1 is an exemplary illustration of a prior art singulation cooling system.
Figure 2:
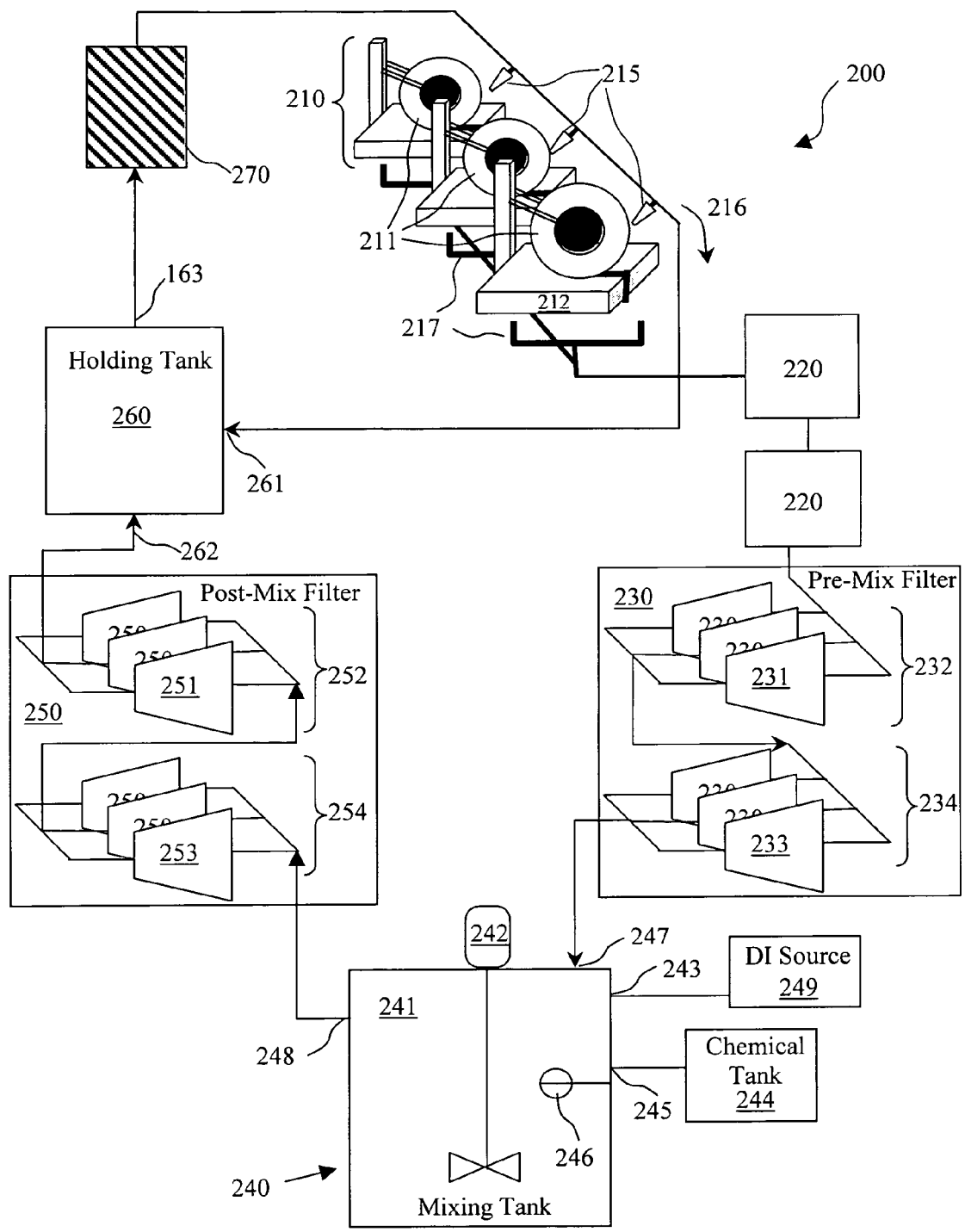
FIG. 2 is an exemplary illustration of one embodiment of a singulation process cooling system.

FIG. 2 illustrates a system 200 for a cooling loop for the cooling of a singulation process. The system forms a coolant loop having of at least one coolant deliver means 215, for delivering to saw blade 211. A used coolant collection apparatus 217 is coupled to deliver used coolant to one or more recycle tanks 220. A premixing filtering means 230, is coupled to receive used coolant from the recycle tanks 220. A mixing system 240 is coupled to a received filtered used coolant from the premixing filtering means 230 and also to a deionized water source 249 and a chemical source 244. A post mixing filter 250, is coupled to receive mixed coolant from the mixing system 240 and to deliver filtered coolant to a holding tank 260. A heat exchange 270 receives coolant from the holding tank 260 and controls the temperature of the coolant to be within a predetermined range of temperatures. A bypass loop is formed by the coolant not used by the delivery means 215 and returned to the holding tank 160 through the bypass coolant return inlet 261.

The singulation process has comprised of one or more singulation saws 210. Each saw 210 has a saw blade 211 for cutting a substrate 212 into single dice. Preferably the substrate 212 is a semiconductor substrate but other types of substrates are contemplated. The saw blade 211 and the substrate 212 are cooled by a coolant provided by a delivery means 215. The coolant delivery means 215 can be any standard means for delivering a fluid under pressure, including but are not limited to a pipe aperture, a nozzle, and a sprayer. The coolant absorbs cool heat to least one of the saw blade 211 and the substrate 212.

A used coolant collection means 217 is provided for the capture and recycling of the used coolant. The collection means preferably has a pan located under the saw 210 but other collection means are contemplated. The saw 210 could be in an enclosed chamber from which the coolant is collected, a vacuum system could be used for collection, or the floor with a drain (not shown) near the singulation tool.

The recycle coolant collection means 217 is coupled to at least one recycle tank 220. The recycle tank 220 is configured for the gravitational settling of any particulates from the recycle coolant. Preferably the recycle tanks 220 are in series but other configurations are contemplated. The particulates are particles of the substrate and of the sawblade generated when the saw 210 cuts the substrate 212. The one or more recycle tanks 220 can be open or enclosed or a combination thereof. Further, the recycle tanks 220 can contain a means for removing the particulate sludge that settles to the bottom of the tanks. The recycle tanks 220 are able to be configured to be cleaned while the cooling system 200 is in operation or when not in operation.

An optional pre-mix filter 230 is coupled to receive used coolant from the recycle tanks 220 and to deliver coolant to the mixing tank 240. The premix filter 230 is shown in one embodiment having a first stage of filtering 232 and a second stage of filtering 234. The invention can embody a single stage of filtering or more than two stages of filtering. The first stage 232 and the second stage 234 are includes a plurality of filter elements 231 and 233 operating in parallel. These filter elements 231 and 233 are configured to be replaceable while the cooling system is still operating. Each filter element can have a valve coupled upstream and another coupled downstream. By closing both valves the filter element 3 operationably removed from the system. By closing both valves the filter element can be physically removed and replaced or cleaned. In one embodiment, the pre-mix first stage 232 filter elements is configured to block larger particles than the second stage filter elements. In one embodiment, the first stage filters 232 are configured to filter out 100 micron particles and the second stage filters 234 are configured to remove 50 micron particles.

The mixing system 240 is coupled to receive coolant from the pre-mix filter 230. The mixing system 240 inputs recycled coolant into the mixing tank 241 from the pre-mix filter inlet 247. When enough coolant is lost, either through evaporation, cleaning of the recycle tank 220, or through losses during singulation, replacement coolant is prepared in the mixing tank 240. Preferably, the need for preparing more coolant is detected by a tank level sensor 246. When an indication that additional coolant needs to be introduced deionized water (DI) is input into the tank chamber 241 from the DI inlet 243. A chemical is also added to the mixing tank chamber 241 in a controlled ratio. The DI water, the chemical, and the recycled water are mixed by a mixer 242. The coolant resulting from the chemical mixed with the DI water preferably has properties in addition to including inhibiting oxidization and lubrication.

The mixing system outlet 248 is coupled to an optional post-mix filter 250. The filter 250 is shown in one exemplary embodiment having a first stage of filtering 254 and a second stage of filtering 252. Also contemplated by the invention is an embodiment having a single stage of filtering or more than two stages of filtering. The first stage of filtering 254 and the second stage 254 preferably comprise a plurality of filter elements 253 and 251 operating in parallel. These filter elements 251 and 252 are preferably able to be configured to be replaceable while the cooling system 200 is still operating. In one embodiment, the first stage 254 of filters are configured to filter larger particles than the second stage. In one embodiment, the first stage filters 254 are configured to filter out substantially 25 micron or larger particles and the second stage filters 252 are configured to block 10 micron or larger particles.

The holding tank 260 preferably is configured with a coolant inlet 262 coupled to the post mixing filter 250, a coolant bypass inlet 261, and the coolant delivery bypass inlet 261. The holding tank 260 is sized and configured to prevent bubbles form getting into the holding tank outlet 163 and thereby interrupting the flow of cooling fluid to the saw blade 211. In one embodiment, a tank size of 1000 liters provides sufficient volute to prevent bubbles from being introduced into the cooling loop. The outlet of the holding tank is positioned to be below an upper level of the coolant. The holding tank outlet 163 is coupled to the heat exchanger 270.

The heat exchanger 270 is configured to maintain a controlled temperature of the coolant. The heat exchanger can be of a number of types including but not limited to shell and tube, plate heat exchanger, and a fluid heat exchanger. Preferably, the coolant is temperature controlled to between 18-20 degrees centigrade.

It will be appreciated by one skilled in the art that a number of pumps and valves can be placed within the circulation loops to control the movement of the coolant through the filters and into and out of tanks and to the coolant delivery means.

Figure 3:
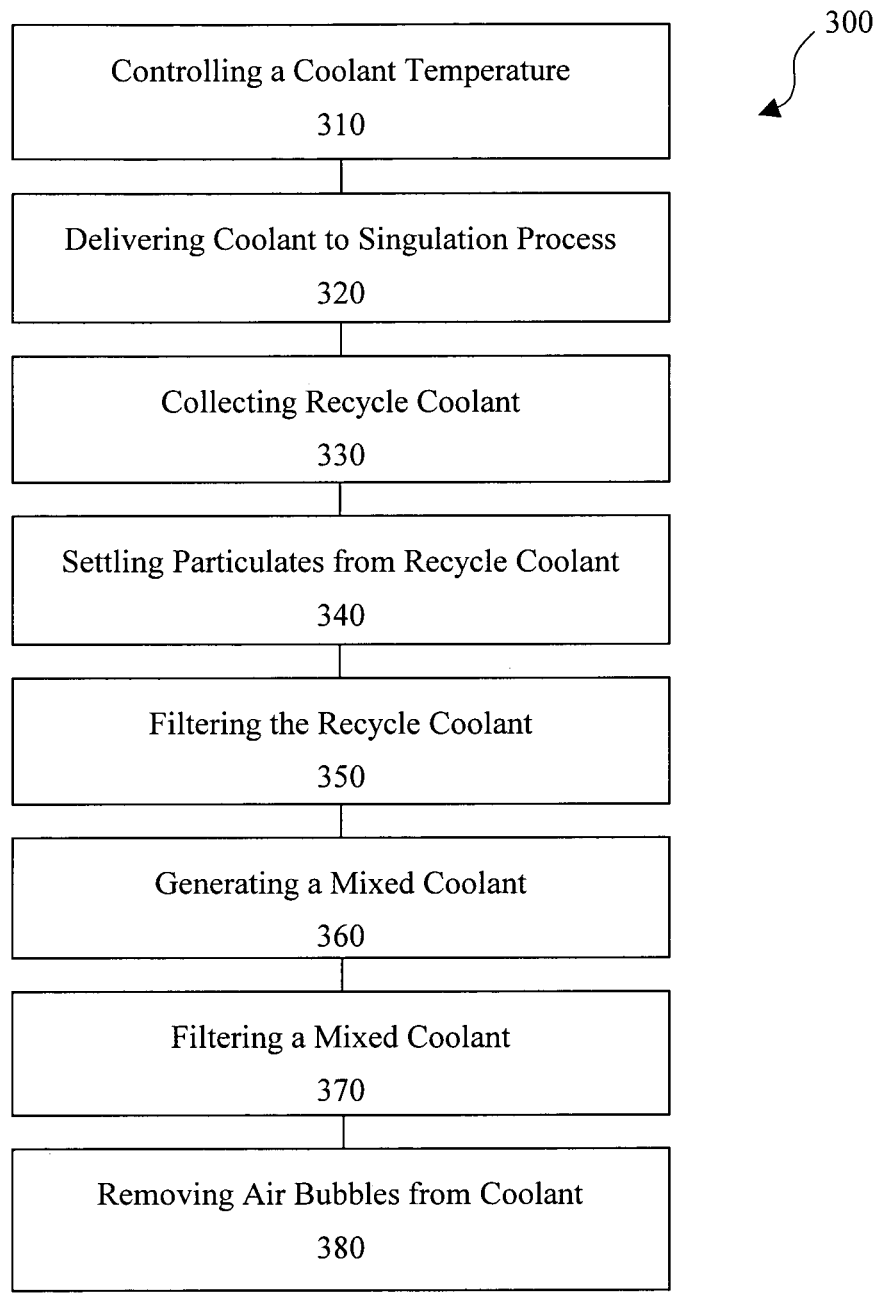
FIG. 3 is an exemplary illustration of the method step of a singulation cooling process.

FIG. 3 shows an exemplary of the inventive steps for a method of 300 for the cooling of a singulation process. The process is comprised of controlling a coolant temperature 310, delivering the coolant to a singulation process 320, collection the recycle coolant 330, settling the particulates from the recycle coolant 350, generating a mixed coolant 370, and removing air bubbles from the coolant 380.

The method begins but is not limited to beginning at step 310. At the step 310, the coolant is temperature controlled. A temperature is selected that provides sufficient cooling during singulation but not so cold as to cause thermal mechanical stresses to the substrate. Any applicable temperature control means can be used including including but not limited to shell and tube, plate heat exchanger, and a fluid heat exchanger. Preferably, in this step the coolant is temperature controlled to be a temperature between 18-20 degrees centigrade.

In a step 320, coolant is delivered to the singulation process. The coolant delivery means can be any method for delivering a coolant under pressure. These methods can include but are not limited to coolant flowing through a pipe aperture, a nozzle, or with a sprayer, preferably through a nozzle.

In a step 330, the coolant having been used for cooling is collected for recycling. Any applicable collection method is contemplated including but not limited to gravitational flow, and vacuum. Preferably a pan is used to collect the recycle coolant.

In a step 340, the recycle coolant is put through a settling step wherein particulates in the coolant are allowed to settle out of the coolant. Preferably the settling occurs in one or more tanks where the build up of sludge can be cleaned from the tanks while the method of cooling is on going.

In an optional step 350, the recycle coolant is filtered. Preferably the recycle coolant is filtered by a plurality of filtering elements wherein a first stage the filtering remove 100 micron particles and in a second stage the filtering elements removes 50 micron particles.

In a step 360, a mixed coolant is generated. Additional mixed coolant is formed when it is detected that there is a requirement for additional coolant. This indication can come from a coolant level indicator. The mixed coolant is generated by combining and mixing the recycle coolant, if available, and deionized water and a chemical in a controlled ratio.

In an optional step 370, the mixed coolant is filtered. Preferably the filtering is performed in a manner such that the filtering components can be replenished, cleaned, or replaced while the singulation cooling method 300 is ongoing. Preferably the filtering of the mixed coolant removes particles smaller than the particles removed in the optional step 350. Preferably the filtering is performed in two stages, the downstream stage removing particles smaller than the stage upstream. Preferably the upstream filter stage removes particles substantially 25 microns and more in size and the downstream filter stage removes particles 10 microns and more in size.

In an optional step 280 air bubbles are removed from the coolant. The bubbles are removed in a manner such that they are substantially eliminated from delivery to the singulation process. Preferably this is performed by storing the coolant in a holding tank sufficiently large for any bubble introduced by mixing or other means to settle out and by drawing out coolant below a surface level of coolant in the holding tank.

It will be readily apparent to those skilled in the art that the steps 300 can be performed continuously, cyclically, and/or in batches. Also, it would be apparent to those skilled in the art that the steps within the inventive method 300 can be practiced in differing order and remain within the sprit of the invention.

In operation, the mixing tank 240 prepares enough coolant to substantially fill the holding tank 260. The deionized (DI) water inlet 243 and chemical inlet 245 are configured to be input into the mixing tank chamber 241 DI water and chemical in a controlled ratio. The coolant is prepared with the mixer 242 and pumped to the holding tank 260 through the post mixing filter 250 until the holding tank 260 is substantially full. The DI inlet 243 and chemical inlet 245 are configured to stop the input when the mixing tank sensor 246 detects a predetermined tank level. The coolant is pumped to the heat exchanger 270 to control the temperature of the coolant. Preferably, the coolant is cooled to 18-20 degrees centigrade. The coolant is then pumped to the coolant delivery means 215 where a portion of the coolant is delivered to the saw blade 211 and the cutting interface between the saw blade 211 and the substrate 212. The remaining coolant returns to the holding tank 260 through the coolant bypass inlet 261. Having a bypass loop has the advantage of having coolant at the controlled temperature quickly available at the coolant delivery means when it is time to start the saw 210. Otherwise, the coolant can warm up in the line between the coolant temperature control means and this warmed coolant would have to be flushed from the lines before starting singulation.

Reference has been made in detail to the preferred and alternative embodiments of the invention, examples of which are illustrated in the accompanying drawings. While the invention has been described in conjunction with the preferred embodiments, it will be understood that they are not intended to limit the invention to these embodiments. On the contrary, the invention is intended to cover alternatives, modifications and equivalents, which can be included within the spirit and scope of the invention. Furthermore, in the detailed description of the present invention, numerous specific details have been set forth in order to provide a thorough understanding of the present invention. However, it should be noted that the present invention can be practiced without these specific details. In other instances, well known methods, procedures and components have not been described in detail as not to unnecessarily obscure aspects of the present invention.

What is claimed is:

1. A system for cooling at least one singulation process comprising:
    a first coolant loop comprising:
        a saw for singulating semiconductor devices
        a least one coolant delivery means configured to deliver coolant to the saw;
        a coolant collection means positioned under the saw configured to capture a recycled coolant, the recycled coolant comprising particulates resulting from the singulating of the semiconductor devices;
        at least one recycle tank positioned downstream of the saw and coupled with the coolant collection means such that the recycle tank receives the recycled coolant with the particulates, wherein the at least one recycle tank is configured to enable the particulates to gravitationally settle to a bottom of the recycle tank such that in the recycle tank the particulates settle out of the recycled coolant;
        a mixing tank configured downstream of the at least one recycle tank to receive the recycled coolant without settled particulates;
        a coolant temperature control means: and
        a bypass loop coupled to the coolant delivery means and to the coolant temperature control means, the bypass loop comprising at least a bypass flow that enables coolant to return to the coolant temperature control means without being collected by the coolant collection means, the at least one recycle tank and the mixing tank.

2. The system of claim 1, further comprising a plurality of course filters configured upstream of the mixing tank and configured to remove large particles in the coolant.

3. The system of claim 2, further comprising a plurality of fine filters configured downstream of the mixing tank and configured to remove from the coolant particles smaller than the course filter remove.

4. The system of claim 3, wherein the course filter is comprised of a plurality of course filter elements configured in parallel, wherein the fine filter is comprised of a plurality of fine filter elements configured in parallel, and wherein at least one of the course filter elements and the fine filter elements are exchangeable during operation of the first coolant loop.

5. The system of claim 3, wherein the course filters remove particles 50-100 microns in a greatest dimension and the fine filter remove particles between 10-25 microns in a greatest dimension.

6. The system of claim 1, further comprising a holding tank within the first coolant loop configured to prevent air bubbles from getting to the coolant delivery means.

7. The system of claim 6, wherein the mixing tank comprises:
    a controllable deionized water source inlet for providing deionized water;
    a controllable chemical inlet for providing a chemical;
    a detector for detecting a coolant level in the mixing tank, wherein the system is configured to control a ratio of deionized water and chemical based on the coolant level;
    a recycled coolant inlet coupled to the first loop;
    a mixer for mixing the deionized water, the chemical, and the recycled coolant; and
    a mixing tank coolant outlet coupled to the first loop.

8. The system of claim 7, wherein the coolant temperature control means maintains a temperature of 18-20 degrees centigrade at the coolant delivery means.

9. The system of claim 7, wherein a volume of the holding tank is greater than 1000 liters.

10. The system of claim 1, wherein the recycle tank comprises a particulate removal element that removes the particulates in the recycled coolant from the recycle tank.

* * * * *